United States Patent [19]

Kremer et al.

[11] Patent Number: 4,999,082
[45] Date of Patent: Mar. 12, 1991

[54] PROCESS FOR PRODUCING MONOCRYSTALLINE GROUP II-IV OR GROUP III-V COMPOUNDS AND PRODUCTS THEREOF

[75] Inventors: Russell E. Kremer, Woodland Park; David M. Francomano, Colorado Springs, both of Colo.

[73] Assignee: Akzo America Inc., New York, N.Y.

[21] Appl. No.: 406,987

[22] Filed: Sep. 14, 1989

[51] Int. Cl.$^5$ ............................................. C30B 11/04
[52] U.S. Cl. ................................. 156/605; 156/616.1; 156/616.2; 156/616.3; 156/616.4; 156/616.41; 156/DIG. 83; 252/62.3 GA
[58] Field of Search .................. 156/605, 616.1, 616.2, 156/616.3, 616.4, 616.41, DIG. 83; 252/62.3 GA

[56] References Cited

U.S. PATENT DOCUMENTS

| | | | |
|---|---|---|---|
| 3,245,674 | 4/1966 | Baer et al. | 156/DIG. 83 |
| 3,630,906 | 12/1971 | Willardson et al. | 156/605 |
| 3,777,009 | 12/1974 | Menashi et al. | 156/616.2 |
| 4,058,579 | 11/1977 | Lashway | 156/DIG. 83 |
| 4,083,748 | 4/1978 | Gault | 156/616 R |
| 4,264,406 | 4/1981 | Hacskaylo | 156/616.41 |
| 4,404,172 | 9/1983 | Gault | 156/616 R |
| 4,521,272 | 6/1985 | Gault | 156/616 R |
| 4,840,699 | 6/1989 | Khattak et al. | 156/616.2 |
| 4,923,561 | 5/1990 | Chemans et al. | 156/616.4 |

FOREIGN PATENT DOCUMENTS

| | | | |
|---|---|---|---|
| 59-8690 | 1/1984 | Japan | 156/DIG. 83 |
| 62-41792 | 2/1987 | Japan | 156/616.41 |

OTHER PUBLICATIONS

Blum et al., "Growing Single Crystals of High-Melting, Decomposable Compounds", IBM Technical Bulletin, vol. 9, No. 12, May 1967, pp. 1674–1676.
Willardson et al., "Semiconductors and Semimetals, vol. 20, Semi-Insulating GaAs", Academic Press, Inc., Orlando, 1984, pp. 36 to 40.
*Crystal Growth: A Tutorial Approach* (Proceedings of the Third International Summer School on Crystal Growth, edited by Bardsley et al., 1977, pp. 157-158 and 166-167 and 102-106).
*Handbook on Semiconductor Materials, Properties and Preparation*, (Series Ed. T. S. Moss, vol. Ed. S. P. Keller, vol. III, pp. 258-259, 2nd Edition, 1983).
"Liquid Encapsulated, Vertical Bridgman Growth of Large Diameter, Low Dislocation Density, Semi-Insulating GaAs" (*Journal of Crystal Growth*, Hoshikawa et al., vol. 94 (1989)), pp. 643-650.
D. C. Look et al., "Uniformity of 3-in., Semi-Insulating Vertical-Gradient-Freeze GaAs Wafers", *J. Appl. Phys.* 66(2), Jul. 15, 1989.
Litton Airtron GaAs specification sheet, 1985 (two pages).
Showa Denko K.K. GaAs substrate specification, Aug. 22, 1989 (two pages).
S. K. Brierley et al., "Correlation Between Implant Activation and EL2 in Semi-Insulating GaAs", 5th (List continued on next page.)

*Primary Examiner*—Olik Chaudhuri
*Assistant Examiner*—Robert Kunemund
*Attorney, Agent, or Firm*—David H. Vickrey; Louis A. Morris

[57] ABSTRACT

This disclosure relates to a process for producing monocrystalline Group II-IV or Group III-V compounds from the polycrystalline form of said Group II-IV or Group III-V compound, said process comprising coating the interior surface of a crucible with a powdered solid having a melting point higher than the polycrystalline form of the compound, placing an amount of polycrystalline compound into the coated crucible, heating the crucible to produce a melt while maintaining the powder in solid form and cooling the crucible to produce a solid compound. The preferred powdered solid is pyrolitic boron nitride. The process may be used to produce, inter alia, semi-insulating gallium arsenide having a neutral EL2 concentration greater than or equal to about $0.85 \times 10^{16} cm^{-3}$ and a dislocation density between about 500 cm$^{-2}$ and 7,800 cm$^{-2}$.

21 Claims, 1 Drawing Sheet

OTHER PUBLICATIONS

Conf. on Semi-insulating III-V Materials, Malmo, Sweden, 1988.

*Crystal Growth* (edited by Bryan Pamplin, First Ed. 1975, Second Ed. 1980, pp. 6-9, 284-287).

Chang et al., "Vertical Gradient Freeze Growth of Gallium Arsenide and Naphthalene: Theory and Practice", *Journal of Crystal Growth* 22 (1974), pp. 247-258.

Abernathy et al., "Growth and Characterization of Low Defect GaAs by Vertical Gradient Freeze", *Journal of Crystal Growth*, 85 (1987) pp. 106-115.

Clemans and Conway, "Vertical Gradient Freeze Growth of 75 mm Diameter Semi-Insulating GaAs" from the Proceedings of the Fifth Conference on Semi-Insulating Materials in Malmö, Sweden, 1988.

Clemans et al., "The Production of High Quality, III-V Compound Semiconductor Crystals", *AT & T Technical Journal*, Jul., Aug., vol. 65, Issue IV, pp. 87 & 97.

Gault et al., "A Novel Application of the Vertical Gradient Freeze Method to the Growth of High Quality III-V Crystals", *Journal of Crystal Growth*, 74 (1986) pp. 491-506.

Swiggard, "Liquid Encapsulated Vertical Zone Melt (VZM) Growth of GaAs Crystals" *Journal of Crystal Growth*, 94 (1989).

Bourret et al., "Vertical Seeded Melt-Growth of GaAs", submitted to the Ninth Annual Conference on Crystal Growth, Aug. 20-25, 1989.

Kremer et al., "Vertical Bridgman Growth of GaAs", Materials Research Society Symposium Proceedings, Fall Meeting 1988, vol. 144, printed 1989.

Kremer et al., "Semi-Insulating GaAs Grown by the Vertical Bridgman Method", Proceedings of the 1988 U.S. Conference on GaAs Manufacturing Technology, 69.

Kremer et al., "Low-Dislocation Density GaAs Grown by the Vertical Bridgman Method", Proceedings of the Industry-University Advanced Materials Conference, presented Mar. 7, 1989.

Kremer et al., "Low Dislocation Density GaAs Grown by the Vertical Bridgman Technique", Proceedings of the Colorado Microelectronics Conference, Presented Mar. 31, 1989.

PROCESS FOR PRODUCING MONOCRYSTALLINE GROUP II-IV OR GROUP III-V COMPOUNDS AND PRODUCTS THEREOF

BACKGROUND OF THE INVENTION

The invention relates to a process for producing monocrystalline Group II-VI or Group III-V compounds from their polycrystalline precursors.

Monocrystalline compounds formed by the combination of an element from Group II or III of the Periodic Table and an element from Group VI or V of the Periodic Table are critical to the electronics industry. Examples of such monocrystalline compounds are gallium arsenide (GaAs), gallium phosphide (GaP), indium phosphide (InP) and cadmium telluride (CdTe).

Monocrystalline Group II-VI compounds and Group III-V compounds may be referred to as "semiconductors" ("SC") with resistivities typically within the broad range of about 1e-3 ohm-cm to about 10e10 ohm-cm. The conductivity of semiconductors can be varied by adding certain impurities ("dopants") to the monocrystalline material. Depending on the impurity or dopant added, semiconductors can be either n-type (excess electrons) or p-type (lack of electrons). When the Group III-V compound is GaAs, silicon is the most commonly employed n-type dopant, however, tellurium or sulfur are also useful for such applications. GaAs that is heavily doped with silicon can exhibit an n-type resistivity approaching 1e-3 ohm-cm. The most commonly employed p-type dopant is zinc, however, beryllium or carbon may also be used. Zinc-doped material can also have a p-type resistivity approaching 1e-3 ohm-cm. Group III-V and II-VI semiconductors are used primarily for optoelectronic purposes such as light emitting diodes (LED's), laser diodes, photocathodes and the like and electronic applications such as transistors.

Group III-V or II-VI monocrystalline compounds which have a resistivity greater than about 1e-7 ohm-cm are sometimes referred to as "semi-insulating" ("SI") semiconductors. SI semiconductors are sometimes referred to as "semi-insulators". Depending on the Group III-V or II-VI compound, the monocrystalline form may be "semi-insulating" in its "undoped" or intrinsic state (e.g., GaAs, CdTe) or in a "doped" state (e.g., GaAs with chromium as a dopant or InP with iron as a dopant).

Semi-insulating GaAs can have a resistivity more than eleven orders of magnitude greater (e.g., 1e8) than that of doped semiconducting material. While the electrical properties of semiconducting material are controlled primarily by the dopant(s), semi-insulating GaAs relies on the relationships among various electron energy levels. These relationships can be discussed most simply in the terms of a three-level model. The three levels are the shallow donor (or silicon) level, the shallow acceptor (or carbon) level and EL2 (or deep donor) level. In semi-insulating GaAs, EL2 dominates the charge balance, placing the Fermi level near the EL2 energy level. Since the EL2 energy level is deep in the band gap, SI GaAs obtains high resistivity.

For gallium arsenide, EL2 is a defect associated with an As-on-Ga antisite and is, therefore, related to the stoichiometry of the material. However, the concentration of EL2 is also strongly dependent on the thermal history of the material. High temperature anneals followed by cooling can result in the creation or destruction of EL2. A current, persistent problem is that present after-production modification processes (e.g., annealing) tend to be at high temperatures which are likely to significantly reduce the EL2 level and thus seriously reduce the effectiveness of the SI GaAs. Efforts to increase EL2 levels have had a negative effect on other properties of the SI GaAs, especially its structural integrity. One measure of structural integrity is "dislocation density". Dislocations can be revealed by etching the monocrystalline material (typically with KOH for GaAs). Where a dislocation intersects the surface, an etch pit results. Thus, the etch pit density ("EPD") provides an indication of the dislocation density of the material. The terms "EPD" and "dislocation density" are frequently used interchangeably. For electronic and opto-electronic applications a relatively high EL2 and a relatively low EPD are desired. Prior art methods have been unable to achieve this combination of features, particularly when large diameter (e.g., greater than about 2.5 inches) wafers are needed.

Although the EL2 level dominates the electrical properties of SI GaAs, the resistivity and thus the semi-insulating character of monocrystalline GaAs can be increased by the controlled addition of dopants such as carbon.

Semi-insulating GaAs is typically used for integrated circuit applications.

Various processes are known for preparing monocrystalline semiconducting compounds and monocrystalline semi-insulating semiconducting compounds from polycrystalline materials.

One method for producing a monocrystalline compound is the horizontal Bridgman (HB) process. Here the polycrystalline compound is placed in an half-cylinder-shaped "boat" having a monocrystalline seed at one end. The boat is sealed within a quartz ampoule. Also within the ampoule, but outside the boat, is a separate amount of the more volatile component (such as arsenic) of the polycrystalline melt. The separate volatile component is present to help control the stoichiometric ratios in the final monocrystalline product. The quartz ampoule is sealed to prevent escape of the volatile compound. The polycrystalline material is heated to its molten form. A temperature gradient is then passed over the melt by physically moving a furnace horizontally from the seed to the other end of the boat to directionally solidify the material and form a monocrystalline compound. The temperature gradients in the HB process are quite low (about 1° to about 15° C./cm). Since dislocations are created by large temperature gradients, the small gradients employed in the HB process result in a monocrystalline product which has low dislocations (e.g., about 100 to 10,000 cm$^{-2}$). However, a problem is presented by the geometry of the HB boat. The "half-cylinder" shape of the HB boat produces a half-cylinder monocrystalline ingot. Most SI and many SC products are used in the form of circular wafers. Cutting circular wafers from half cylinder ingots is an inefficient use of material and time. Further, for consistent electrical and structural properties in each wafer, it is preferable to cut the wafers perpendicular to the growth axis. This is not practical with the "half-cylinder" shape of the HB produced ingot if circular wafers are desired.

For these and other reasons, vertical growth processes for producing monocrystalline electronic materials are being investigated.

The liquid encapsulated Czochralski (LEC) method generally comprises dipping a monocrystalline seed into molten polycrystalline material and slowly withdrawing the seed vertically through a liquid layer of some encapsulant. The melt and seed are contained inside a steel chamber at high pressure to prevent the volatile component (either Group V or Group VI) of the polycrystalline compound from leaving the melt. The temperature gradients used in the LEC process are usually quite high, on the order of 50° C./cm. or more. Consequently, LEC grown material has a large number of dislocations, e.g., 50,000 to 100,000 cm$^{-2}$. The LEC method shows particular utility in the production of semi-insulating material, but can also be used to produce semiconducting material if the desired impurities are added to the melt. However, the LEC method has several drawbacks. Materials produced by the LEC method tend to have very high dislocation densities and low uniformity. Diameter control is difficult. Also, capital and labor costs are high.

Another vertical growth process, the vertical gradient freeze method (VGF), places a polycrystalline material inside a vertically-oriented crucible or boat. The bottom of the crucible contains a monocrystalline seed of the Group II-VI or Group III-V compound to be produced. Generally, the polycrystalline material in the crucible is melted, then the temperature of the entire molten compound is reduced while distinct temperature gradients are maintained over various segments of the crucible. U.S. Pat. No. 4,521,272 discloses a gradient freeze method for growing single crystal semiconductor compounds. The crucible has three distinct regions, each region having its own distinct temperature gradient. Single crystal semiconductors are formed by slowly cooling the molten material while maintaining these temperature gradients. U.S. Pat. No. 4,404,172 discloses various apparatuses for growing single crystal semiconductor compounds by the VGF method. One group of apparatuses is comprised of a chamber which contains and volatizes the volatile component of the compound to be grown, the chamber being in communication with the growth crucible. Other apparatuses disclosed are comprised of a crucible support means having a configuration to reduce radial heat flow and enhance axial heat flow. The importance of axial heat flow is discussed in *Crystal Growth: A Tutorial Approach* (Proceedings of the Third International Summer School on Crystal Growth, Edited by Bardsley et al., 1977, pp. 157-8 and 166-7).

The vertical Bridgman (VB) method is another process for preparing monocrystalline compounds of the types previously described. Generally, a VB process employs a vertical furnace having at least one hot zone and at least one cold zone. These zones are designed to provide a furnace temperature profile comprising a relatively flat hot zone and a relatively flat cold zone separated by a transition zone having a temperature gradient of about 5°-20° C./cm. A vertically oriented crucible (usually constructed of pBN) adapted to contain Group II-VI or Group III-V compound is positioned within a sealed ampoule. Monocrystalline growth proceeds by slowly raising the furnace while holding the crucible-and-ampoule assembly stationary. (It is also possible to hold the furnace stationary and move the crucible-and-ampoule assembly. This, however, may cause vibration problems with the crucible-and-ampoule assembly.) In operation, a VB growth process involves (1) placing a monocrystalline seed in the bottom of the crucible (which may have a specially adapted "seed well" for holding the seed), (2) loading polycrystalline material in the crucible, (3) placing the crucible in the ampoule, sealing the ampoule and placing this assembly on a pedestal (which may optionally rotate) inside the vertically oriented furnace described above, (4) heating the polycrystalline material, and the top portion of the monocrystalline seed, above its melting point and (5) moving the furnace up the length of the molten polycrystalline material to form a solid monocrystalline material. The monocrystalline Group II-VI or Group III-V ingot is then removed from the crucible and "sliced" into wafers for various electronic and/or optoelectronic uses.

As pointed out in the *Handbook on Semiconductor Materials, Properties and Preparation*, (Series Ed. T. S. Moss, Vol. Ed. S. P. Keller, Vol. III, pp. 258-59, 2nd Ed., 1983), a continuing problem with monocrystalline growth processes which employ a crucible (sometimes referred to as a "boat") for holding the Group II-VI or Group III-V compound is that the monocrystalline ingot has tendency to adhere to the crucible surfaces. This raises the obvious problem of removal of the ingot from the crucible. Additionally, the sites where the ingot adhered to the crucible surfaces tend to produce undesirable structural and electronic aberrations in the ingot.

*Crystal Growth: A Tutorial Approach* (cited above) at page 105 discloses the use of "soft-moulds" (especially bismuth oxide) to solve the problem of crystal adhesion. "Liquid Encapsulated, Vertical Bridgman Growth of Large Diameter, Low Dislocation Density, Semi-Insulating GaAs" (*Journal of Crystal Growth*, Hoshikawa et al., Vol. 94 (1989)) suggests the use of boric oxide, $B_2O_3$, to suppress decomposition and evaporation of arsenic from molten and crystalline GaAs during vertical Bridgman processes. However, such processes are not entirely successful in that (1) it may still be difficult to remove the ingot from the boat, (2) the oxide has a tendency to contaminate the melt and/or (3) the oxide may stress or fracture the resulting solid ingot due to differences in the coefficient of thermal expansion.

We have found a method to overcome the above-described adherence problem in monocrystalline growth processes employing a crucible. The method is achieved without adversely affecting the electrical or structural properties of the resulting monocrystalline ingot. Additionally, we have found that the process of the current invention can be used to produce an improved semi-insulating material, particularly GaAs.

As discussed earlier, the resistivity, and thus the semi-insulating character, of monocrystalline GaAs can be increased by the controlled addition of dopants, such as carbon. In the LEC method of producing monocrystalline GaAs the exposure of the GaAs melt to graphite parts of the furnace virtually assures the presence of the carbon in the monocrystalline GaAs. The amount of carbon incorporated into the LEC-produced GaAs may be controlled by varying the water content of the $B_2O_3$ encapsulant typically used in the LEC process.

However, the monocrystalline compounds produced by various Bridgman processes are frequently grown in sealed ampoules and are thus isolated from graphite sources. Further, controlled carbon doping is a potential problem for all methods of producing monocrystalline compounds. Consequently, the current invention also comprises a method for controlled carbon doping of monocrystalline Group II-VI or Group III-V compounds.

SUMMARY OF THE INVENTION

The current invention is a process for producing monocrystalline Group II-VI or Group III-V compound from the polycrystalline form of said Group II-VI or Group III-V compound, said process comprising:

(a) coating the interior surfaces of a crucible with a powdered solid, said powdered solid having a melting point higher than the melting point of said polycrystalline form of said compound, (b) placing an amount of said compound in its polycrystalline form into said coated crucible, (c) placing said coated crucible containing said compound into a heating means, (d) heating said coated crucible containing said compound to produce a melt of said compound within said crucible while maintaining said powdered solid in solid form, and (e) cooling said crucible and said compound to produce a monocrystalline compound.

The preferred powdered solid is boron nitride.

The invention is also directed to a semi-insulating semiconducting material comprised of a monocrystalline gallium arsenide having a neutral EL2 concentration greater than or equal to about $0.85 \times 10^{16}$ cm$^{-3}$ and a dislocation density (or EPD) between about 500 cm$^{-2}$ and about 7,800 cm$^{-2}$.

Further, the invention comprises a process for producing carbon-doped monocrystalline Group II-VI or Group III-V compound from the polycrystalline form of said Group II-VI or Group III-V compound, said process comprising:

(a) placing a monocrystalline seed into a crucible, (b) placing an amount of polycrystalline compound into the crucible, said polycrystalline compound selected from the group consisting of Group II-VI compounds and Group III-V compounds, (c) placing said crucible containing polycrystalline compound into a quartz ampoule, (d) placing a carbon source inside said ampoule yet outside said crucible, said carbon source being in fluid communication with said polycrystalline compound, (e) sealing said ampoule, (f) placing said sealed ampoule into a furnace, (g) increasing the temperature of said furnace to produce a melt of said polycrystalline compound, and (h) decreasing the temperature of said furnace to cool said melt and produce a carbon-doped monocrystalline compound.

DETAILED DESCRIPTION OF THE INVENTION

The present invention will be described mainly in terms of the production of monocrystalline gallium arsenide (GaAs) by a vertical Bridgman process. However, it is understood that such description is merely exemplary and the inventive concepts are applicable to the production of other Group III-V compounds or Group II-VI compounds by various processes which employ a crucible for containing the Group III-V or Group II-VI compound.

Figure 1:
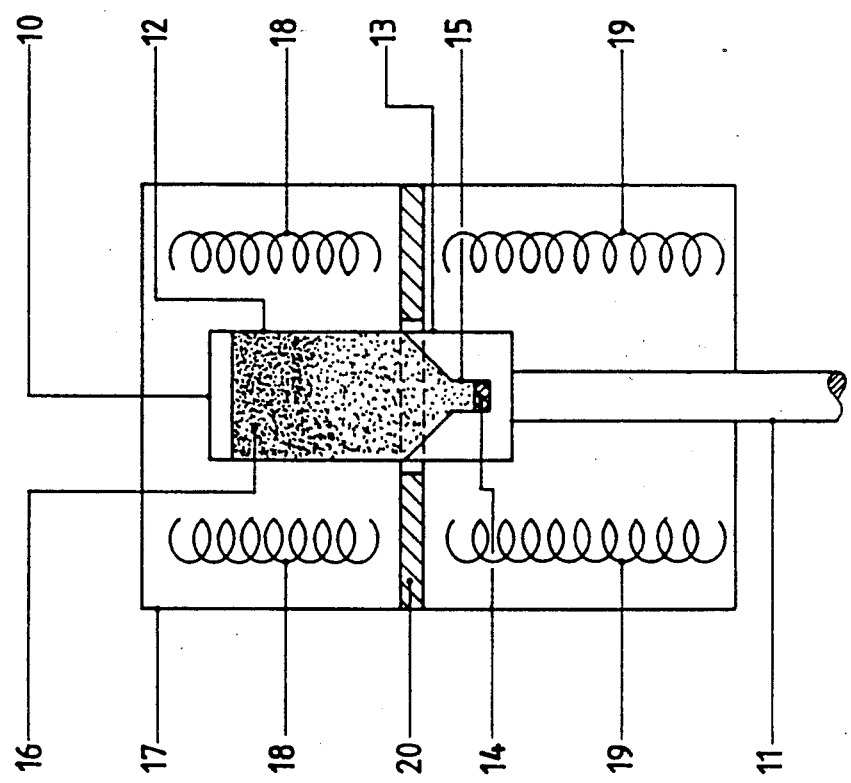
FIG. 1 is a schematic illustration of a portion of a vertical Bridgman apparatus useful in the practice of the current invention.

An apparatus useful for practicing the current invention is now described with reference to FIG. 1. The apparatus comprises ampoule 10 supported by support means 13. Support means 13 is mounted on pedestal shaft 11. In the preferred embodiment support means 13 is capable of rotating about its vertical axis. Positioned inside ampoule 10 is crucible 12. During operation, crucible 12 will contain seed crystal 14 in seed well 15. Crucible 12 will further contain Group II-VI or Group III-V compound 16. Ampoule 10 is positioned in furnace 17, said furnace 17 having a heating means comprised of upper heating component 18 and optionally lower heating component 19. Said heating means is mounted radially about at least a portion of said crucible 12 and is movable parallel to the vertical axis of said crucible 12. Preferably upper heating component 18 is comprised of two heating elements capable of individual temperature control and lower heating component 19 is comprised of two heating elements capable of individual temperature control. In the most preferred embodiment, a baffle 20 is located in furnace 17 between upper heating component 18 and lower heating component 19.

Figure 2:
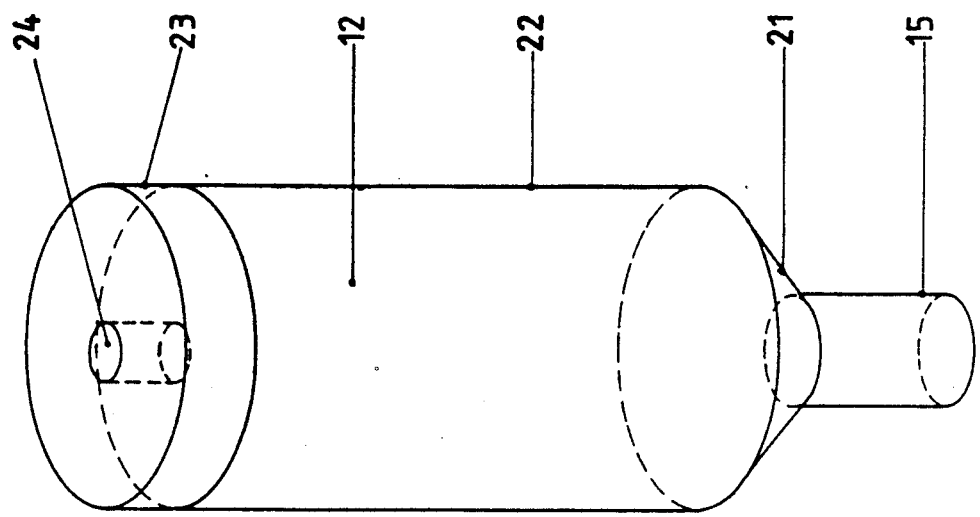
FIG. 2 is a detailed schematic illustration of a crucible useful in the practice of the current invention.

FIG. 2 is a detailed representation of a preferred embodiment of crucible 12. Crucible 12 is preferably constructed of pyrolitic boron nitride. With reference to FIG. 2, the lowest portion of crucible 12 is seed well 15 adapted for holding a seed crystal. Seed well 15 is an elongated member, preferably a small diameter cylinder having vertical walls. Moving up crucible 12, the next component is the cone-shaped transition region 21. Transition region 21 allows the growing crystal to smoothly expand from the diameter of the seed to the final diameter of the monocrystalline ingot from which semiconductor or semi-insulator wafers are cut. The angle of transition region 21 is about 45°. However, larger or smaller angles may also be employed.

Located above transition region 21 is primary growth chamber 22. Most preferably, primary growth chamber 22 is cylindrical and has a diameter slightly greater than the diameter of the wafers to be cut from the monocrystalline semiconductor or semi-insulator ingot. The portion of the single crystal which solidifies in primary growth chamber 22 provides the useful material of the process, so it is desirable that primary growth region 22 have a substantial vertical length. In a preferred embodiment of the current invention, crucible 12 is closed at its upper end with a cap means 23. In another preferred embodiment, opening 24 is provided in cap means 23 to allow fluid communication between the Group II-VI or Group III-V material inside crucible 12 and a source of carbon located outside crucible 12. In this context, "fluid communication" means a free flow of vapor and heat between the inside and outside of the crucible to enable transport of carbon into the crucible and to the melt. In a preferred embodiment, a disk of carbon (not shown in FIG. 2) is placed over opening 24 on top of cap means 23.

In the process of the current invention, a powdered solid having a melting point higher than the melting point of the polycrystalline Group II-VI or Group III-V compound is applied to the interior surfaces of crucible 12. This may be accomplished by any reasonable means suitable to accomplish application of a powder to surfaces. For example, the powder may be dusted in dry form onto the interior surfaces of the crucible. In another embodiment a slurry of a carrier fluid and the powdered solid is prepared. The slurry is applied to the interior surfaces of the crucible and the liquid carrier is evaporated, leaving a deposit of powdered solid. Suitable liquid carriers may be, but are not limited to mixtures of water and alcohol. The preferred alcohol is methanol. Boron nitride is the preferred powdered solid when the Group III-V compound is gallium arsenide.

After coating crucible 12 with powdered solid, monocrystalline seed 15 is placed in seed well 14 and polycrystalline material is placed in the remainder of crucible 12 (transition region 21 and primary growth region 22). Cap means 23 is placed on top of crucible 12, crucible 12 is placed into ampoule 10 (preferably constructed of quartz) which is then sealed in a way which minimizes the free volume in the ampoule. The volatile Group I or Group VI component in an amount sufficient to fill the free volume may be added prior to sealing the ampoule. The sealed crucible-ampoule assembly is then placed on support means 13 in furnace 17. Furnace 17 is lowered and heating components 18 and 19 are employed so that all the polycrystalline material and as much as the top half of the monocrystalline seed are reduced to a melt. To grow a monocrystalline compound, furnace 17 is adjusted so that the temperature of upper heating component 18 is above the melting temperature of the Group III-V or Group II-VI compound and lower heating component 19 is below the melting point and there is a sharp temperature gradient of about 5°-20° C./cm. across the transition zone between the upper hot zone and the lower cool zone. After adjusting furnace 17 to produce the above described temperature profile, furnace 17 is slowly moved up (about 1-8 mm/hr) parallel to the vertical axis of crucible 12 to produce a solid monocrystalline ingot. The ingot may be removed from the crucible and subjected to further processing, e.g. annealing, etc., then sliced into wafers for use, particularly in the electronics industry.

EXAMPLE 1

Semi-insulating gallium arsenide wafers were produced by the process of the current invention. A refined version of the apparatus illustrated in FIGS. 1 and 2 and described above was employed. Powdered boron nitride and a pyrolytic boron nitride crucible were individually heated, in the presence of flowing nitrogen, to 1,100° C. and held at that temperature for 2 hours, then cooled to room temperature. The interior of the crucible was dusted with the powdered boron nitride. A monocrystalline seed crystal of gallium arsenide was placed into the crucible seed well and polycrystalline gallium arsenide was loaded into a crucible having a 78 mm diameter×200 mm length growth region. A small amount of arsenic in excess of that stoichiometrially required to combine with gallium was added to compensate for volatilization of arsenic during heating. There was no source of arsenic external to the crucible. The loaded crucible was placed in a sealed quartz ampoule and the ampoule-crucible assembly was placed on a rotating pedestal (rotation speed: 2 RPM). The hot zone (upper heating component) of the baffled furnace was set at 1,243° C. and the polycrystalline gallium arsenide and the upper half of the seed crystal were melted. The hot zone temperature was reduced at a rate of about 1° C./hour until the temperature reached 1,240° C. (2 degrees above the 1,238° C. melting point of gallium arsenide). The cold zone temperature was set to 1,217° C., producing a temperature gradient across the transition zone of 5° C./cm. At this point, the furnace-lifting drive was started and monocrystalline growth began. Slower drive rates generally produce higher quality material, but the longer time required for growth increases costs. Here, the furnace was raised at about 4 mm/hour. When the entire ingot had been solidified, the temperature in both zones was reduced to 900° C. at a rate of 50° C./hour. This rate is used to avoid thermal stress. The ingot is held at 900° C. for 16 hours then the temperature is slowly lowered to room temperature. The ingot is easily removed from the crucible.

In the industry, a GaAs ingot is graded by the qualities of wafers cut from the last-to-freeze or "tail" portion of the ingot. The dislocation density (or EPD) of a wafer cut from the tail of the above-produced GaAs ingot was determined by the standard method of etching the wafers in molten KOH at 450° C. for 40 minutes. The etch pits were then counted at 41 cites across the wafer. The median EPD and the range of EPD are reported in Table 1. For comparison, tail-portion data for wafers produced by others by the VGF and LEC methods are also reported at Table 1.

The EL2 of tail-portion wafers of the above-produced ingot was measured by infrared absorption. The results are also reported at Table 1 with comparison VGF and LEC data generated by others.

TABLE 1

Electrical and Etch Pit Density (Dislocation Density) Data for Ga

| | EPD ($cm^{-2}$) | | EL2 ($\times 10^{16} cm^{-3}$) | |
|---|---|---|---|---|
| | Median | Range | Median | Range |
| VB (Ex. 1) | 2,700 | 500 to 7,800 | 0.95 | 0.85 to 1.1 |
| VGF (Comp.)[1] | 3,200 | 800 to 18,000 | 0.56 | 0.4 to 0.6 |
| LEC (Comp.)[2,3,4] | 70,000 | 50,000 to 100,000 | 1.4 | 0.6 to 1.8 |

1. D.C. Look et al., "Uniformity of 3-in., Semi-Insulating Vertical-Gradient-Freeze GaAs Wafers", J. Appl. Phys. 66(2), 15 July 1989.
2. Litton Airtron GaAs Specification Sheet, 1985.
3. Showa Denko K.K. GaAs Substrate Specification, 22 Aug. 1989.
4. S. K. Brierley et al., "Correlation between implant activation and EL2 in semi-insulating GaAs", 5th Conf. on Semi-insulating III-V Materials, Malmo, Sweden, 1988.

EXAMPLE 2

The resistivity, and thus the semi-insulating character, of monocrystalline GaAs can be increased by the controlled addition of dopants such as carbon.

In previously known methods for producing monocrystalline GaAs, such as LEC, the exposure of the GaAs melt to graphite parts of the furnace virtually insured the presence of carbon in the monocrystalline GaAs. The amount of carbon incorporated into LEC-produced GaAs may be controlled by varying the water content of the $B_2O_3$ encapsulant used in the process.

The monocrystalline compounds produced by the process of this invention may be grown in sealed quartz ampoules and thus are not exposed to graphite furnace parts. If carbon is desired in the monocrystalline compound, it must be added. Our new process for controllably adding carbon to a Group II-VI or Group III-V monocrystalline compound is described in this Example 2.

Thirteen GaAs ingots were prepared by the method of Example 1 with the following modifications. After loading the polycrystalline GaAs and before placing the loaded crucible into the quartz ampoule, a cap (such as cap 23 in FIG. 1) was fitted on top of the crucible. The 80 mm diameter by 1 mm thick cap had a 10 mm diameter opening in its center as illustrated at FIG. 2. A 22 mm diameter×2-3 mm thick carbon disk was placed on top of the opening. This crucible-carbon disk assembly was placed in the ampoule and the process described in Example 1 was then continued.

GaAs is deemed "semi-insulating" if the resistivity is greater than or equal to about 1e7 ohm-cm. Of the thirteen ingots manufactured by the method of this Example 2, all were semi-insulating at the ingot front and 10 were semi-insulating at the ingot tail.

We claim:

1. A process for producing monocrystalline Group II-VI or Group III-V compound from the polycrystalline form of said Group II-VI or Group III-V compound, said process comprising:
   (a) coating the interior surface of a crucible with a powdered solid, said powdered solid having a melting point higher than the melting point of said polycrystalline form of said compound,
   (b) placing an amount of Group II-VI or Group III-V polycrystalline compound into said coated crucible,
   (c) placing said coated crucible containing said compound into a heating means,
   (d) heating said coated crucible containing said compound to produce a melt of said compound within said crucible while maintaining said powdered solid in solid powered form, and
   (e) cooling said crucible and said compound to produce a monocrystalline compound.

2. The process of claim 1 wherein said powdered solid is boron nitride.

3. The process of claim 1 wherein said coating step (a) further comprises
   (1) forming a slurry of said powdered solid and a liquid,
   (2) applying said slurry to the interior surfaces of said crucible, and
   (3) allowing said liquid to evaporate and thereby leave a deposit of powdered solid on the interior surfaces of said crucible.

4. The process of claim 1 wherein said Group II-VI or Group III-V compound is gallium arsenide.

5. A semi-insulating material comprised of a monocrystalline gallium arsenide having a neutral EL2 concentration between about $0.85 \times 10^{16}$ cm$^{-3}$ and about $1.1 \times 10^{16}$ cm$^{-3}$ and a dislocation density between about 500 cm$^{-2}$ and about 7,800 cm$^{-2}$.

6. A method for producing in a vertically-oriented crucible a monocrystalline Group II-VI or Group III-V material from the polycrystalline precursor of said monocrystalline material, said method comprised of:
   (a) coating the interior surfaces of said crucible with a powdered solid having a melting point higher than the melting point of said polycrystalline precursor,
   (b) placing a monocrystalline seed in the bottom of said crucible,
   (c) loading the remainder of said crucible with said polycrystalline precursor,
   (d) placing said crucible in a vertically-oriented furnace, said furnace capable of producing an upper hot zone and a lower cool zone;
   (e) adjusting said furnace position and said upper hot zone temperature to enable heating of said polycrystalline material to form a melt while about the lower half of said monocrystalline seed remains in solid form;
   (f) setting the temperature in said lower cool zone below the melting point of said monocrystalline material while maintaining the temperature in the upper hot zone above said melting point to establish a solid-liquid interface, and
   (g) moving said furnace and said solid-liquid interface upward while substantially maintaining the temperature settings of step (f) to produce a solid monocrystalline material as said furnace and said solid-liquid interface move vertically upward.

7. The method of claim 6 wherein said monocrystalline Group II-VI or Group III-V material is gallium arsenide.

8. The method of claim 6 wherein said powdered solid is powdered boron nitride.

9. The method of claim 6 further comprising placing, prior to step (e), a carbon source inside said furnace yet outside said crucible, said carbon source being in fluid communication with said polycrystalline precursor.

10. A process for producing carbon-doped monocrystalline Group II-VI or Group III-V compound from the polycrystalline form of said Group II-VI or Group III-V compound, said process comprising:
    (a) placing an amount of polycrystalline compound into a crucible, said polycrystalline compound selected from the group consisting of Group II-VI compounds and Group III-V compounds,
    (b) placing said crucible containing polycrystalline compound into a furnace,
    (c) placing a carbon source inside said furnace and outside said crucible, said carbon source being in fluid communication with said polycrystalline compound,
    (d) supplying heat from said furnace to said crucible and said polycrystalline compound to produce a melt of said compound within said crucible, and
    (e) reducing the temperature of said furnace to cool said crucible to produce a carbon-doped monocrystalline compound.

11. The method of claim 10 further comprising, prior to step (a), coating the interior surfaces of the crucible with a powdered solid having a melting point higher than the melting point of said Group II-VI or Group III-V compound.

12. The method of claim 11 wherein said powdered solid is powdered boron nitride.

13. The process of claim 10 wherein said Group II-VI or Group III-V compound is gallium arsenide.

14. A carbon-doped monocrystalline compound produced by the process of claim 11.

15. A process for producing carbon-doped monocrystalline Group II-VI or Group III-V compound from the polycrystalline form of said Group II-VI or Group III-V compound, said process comprising:
    (a) placing a monocrystalline seed into a crucible,
    (b) placing an amount of polycrystalline compound into the crucible, said polycrystalline compound selected from the group consisting of Group II-VI compounds and Group III-V compounds,
    (c) placing said crucible containing polycrystalline compound into a quartz ampoule,
    (d) placing a carbon source inside said ampoule yet outside said crucible, said carbon source being in fluid communication with said polycrystalline compound,
    (e) sealing said ampoule, (f) placing said sealed ampoule into a furnace, (g) increasing the temperature of said furnace to produce a melt of said polycrystalline compound, and (h) decreasing the temperature of said furnace to cool said melt and produce a carbon-doped monocrystalline compound.

16. The process of claim 15 further comprising, prior to step (a), coating the interior surfaces of the crucible with a powdered solid having a melting point higher than the melting point of said Group II-VI or Group III-V compound.

17. The process of claim 11 wherein said powdered solid is powdered boron nitride.

18. The process of claim 17 wherein said Group II-VI or Group III-V compound is gallium arsenide.

19. A carbon-doped monocrystalline Group II-VI or Group III-V compound produced by the process of claim 15.

20. A semi-insulating material comprised of a monocrystalline gallium arsenide having a neutral EL2 concentration between about $0.85 \times 10^{16}$ $cm^{-3}$ and $1.5 \times 10^{16}$ $cm^{-3}$ and a dislocation density between about 500 $cm^{-2}$ and 7,800 $cm^{-2}$.

21. A semi-insulating material comprised of a monocrystalline gallium arsenide having a neutral EL2 concentration between about $0.85 \times 10^{16}$ $cm^{-3}$ and $1.2 \times 10^{16}$ $cm^{-3}$ and a dislocation density between about 500 $cm^{-2}$ and 7,800 $cm^{-2}$.

* * * * *